(12) United States Patent
Pinon (10) Patent No.: US 11,460,515 B2
(45) Date of Patent: Oct. 4, 2022

(54) COMPACT SUPPLY VOLTAGE GLITCH SENSOR WITH ADAPTIVE AMPLITUDE SENSITIVITY

(71) Applicant: STMicroelectronics (Grenoble 2) SAS, Grenoble (FR)

(72) Inventor: Vincent Pinon, Voiron (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 133 days.

(21) Appl. No.: 17/123,210

(22) Filed: Dec. 16, 2020

(65) Prior Publication Data

US 2021/0270909 A1    Sep. 2, 2021

(30) Foreign Application Priority Data

Feb. 13, 2020   (FR) ...................................... 2001419

(51) Int. Cl.
| | | |
|---|---|---|
| *G01R 31/40* | (2020.01) | |
| *H03F 3/45* | (2006.01) | |
| *H03H 7/01* | (2006.01) | |
| *H03K 5/24* | (2006.01) | |

(52) U.S. Cl.
CPC ......... *G01R 31/40* (2013.01); *H03F 3/45475* (2013.01); *H03H 7/01* (2013.01); *H03K 5/24* (2013.01)

(58) Field of Classification Search
CPC .............. G01R 31/40; G01R 31/31816; G01R 19/16552; H03F 3/45475
See application file for complete search history.

(56) References Cited

U.S. PATENT DOCUMENTS

| | | | |
|---|---|---|---|
| 2005/0118980 A1* | 6/2005 | Pai ..................... | H03H 11/1291 455/340 |
| 2007/0139988 A1 | 6/2007 | Malherbe et al. | |
| 2008/0061843 A1* | 3/2008 | Yanci ..................... | H03K 5/153 327/78 |
| 2009/0195227 A1* | 8/2009 | Morino ..................... | G05F 1/56 323/224 |

(Continued)

FOREIGN PATENT DOCUMENTS

| | | |
|---|---|---|
| EP | 1804199 A1 | 7/2007 |
| FR | 3042876 B1 | 12/2017 |

OTHER PUBLICATIONS

Jiménez, R., et al., "VLSI Implementation of digital frequency sensors as hardware countermeasure", 19th IEEE International Conference on Electronics, Circuits, and Systems (ICECS), Seville, Spain, Dec. 9-12, 2012, pp. 384-387.

(Continued)

*Primary Examiner* — Dominic E Hawkins
(74) *Attorney, Agent, or Firm* — Slater Matsil, LLP (57) ABSTRACT

A circuit includes a voltage comparator with an output, a first input and a second input, the first input being coupled to a first reference voltage terminal. An operational transconductance amplifier has an output coupled to the second input of the voltage comparator, an inverting input coupled to the output of the operational transconductance amplifier, and a non-inverting input coupled to a second reference voltage terminal. A filter capacitor is coupled in series between a power supply terminal and the second input of the voltage comparator.

21 Claims, 6 Drawing Sheets

(56) References Cited

U.S. PATENT DOCUMENTS

2015/0346246 A1 12/2015 Tasher et al.
2017/0115359 A1 4/2017 Leduc et al.

OTHER PUBLICATIONS

Goikoetxea Yanci, Asier, et al., "Characterization of a Voltage Glitch Attack Detector for Secure Devices", 2009 Symposium on Bio-inspired Learning and Intelligent Systems for Security, Aug. 2009, pp. 91-96.

* cited by examiner

COMPACT SUPPLY VOLTAGE GLITCH SENSOR WITH ADAPTIVE AMPLITUDE SENSITIVITY

CROSS-REFERENCE TO RELATED APPLICATIONS

This application claims priority to French Patent Application No. 2001419, filed on Feb. 13, 2020, which application is hereby incorporated herein by reference.

TECHNICAL FIELD

The present description relates to the field of electronic circuits and, and in particular embodiments, to a compact supply voltage glitch sensor with adaptive amplitude sensitivity.

BACKGROUND

Secured chip cards, due to the information that they contain, are coveted by hackers which have consequently developed different attacks in order to attempt to pierce the secrets of the integrated circuit or to render inoperative a protection of processed data, by examining the input/output signals and/or the consumption of the circuit or any other magnitude that is influenced by the operation thereof. In particular, so-called attacks by fault injection consist of provoking a disturbance in the operation of the integrated circuit during the execution of a cryptographic or decoding algorithm and of interpreting the later operation of the circuit in order to attempt to discover the secret quantities. More simply, the disturbance can generate a skip in a program aiming to not execute instructions that can prohibit access to data. The most widespread disturbance in fault injection attacks is a disturbance with the power supply of the circuit ("glitch attack") consisting of provoking a parasite peak of a very short duration in the power supply of the circuit.

In order to try to counter such attacks, integrated circuits include software and/or hardware tools that react to a disturbance in the operation of the circuit (countermeasure), in such a way as to block the operation of the circuit, prevent the output of confidential information, render the results of a calculation unusable, etc. when a fraud attempt is detected.

In particular, integrated circuits are provided with integrated circuit power supply disturbance detectors, which make it possible to detect variations in the power supply of the integrated circuit of which the characteristics (e.g. amplitude, frequency) are representative of a likely attempted attack. Detecting such disturbances makes it possible to implement countermeasures, such as for example acting directly on the circuit by rebooting the central unit and as such prohibiting a possible hacker from taking advantage of the disturbance.

A detector of parasite peaks in the power supply of an integrated circuit has for example been proposed, wherein a disturbance is detected when a voltage derived from the variation in the power supply voltage exceeds the threshold voltage of a transistor, rendering it conductive. Such a detector can for example have the form of a cross-coupled MOSFET or of a circuit such as proposed in application EP1804199 (and counterpart US 2007/139988A1).

Since the threshold voltage of the transistors varies greatly according to the manufacturing methods and the temperature, detecting disturbances cannot be assured in a precise manner and therefore entails substantial tolerances.

Yet, in order to minimize electrical consumption and gain in integration, the trend is to move towards technologies that support increasingly lower power supply voltages. Power supply voltages that use to be about 5 V can now be accomplished with voltages of about 1.5 V, while at the same time the threshold voltage values of power transistors have decreased only somewhat and are still about 700 mV. This then results in much lower power supply variations, less than the threshold voltage levels which make this type of detection system inoperative.

Other detection systems such as the one proposed by patent application FR3042876 (and counterpart US 2017/115359) propose systems that make it possible to avoid the threshold voltage of transistors, but which depend on the parameters of other components, such as resistors, and on polarization current values.

Moreover, all these detectors have substantial sizes. For example, certain detectors use RC filters in series with the power supply. The speed constraint imposes substantial currents and low impedances, and therefore requires the use of high-capacitance and therefore large capacitors.

Finally, since the integrated circuit can need to operate with different power supply voltage values, it is necessary to be able to ensure the detection of any disturbance that exceeds a tolerance range specific to each nominal power supply value, which the detectors used previously do not allow. For example, a tolerance of ±10% for a nominal power supply of 1.5 V entails detecting only disturbances that exceed ±0.15 V, while a tolerance of ±10% for a nominal power supply of 5 V entails detecting only the disturbances that exceed ±0.5 V, and not those comprised between 0.15 V and 0.5 V.

There is therefore a need to improve the precision in detecting disturbances, with detectors that are more precise, smaller and of which the detection thresholds are automatically adjusted to the power supply voltage.

SUMMARY

The present description relates to the field of electronic circuits and, in embodiments, to the detection of voluntary or accidental disturbances in the power supply of an electronic circuit. A particular application is the detection of such disturbances as part of attacks by fault injection in the execution of programs or algorithms by an electronic circuit, typical of an attempt to hack a secure electronic system such as, for example, those used for payment commonly referred to as chip cards (although no actual card may be present).

Embodiments can be used for detecting disturbances in the power supply of an electronic circuit, which are not large, sensitive, with a sensitivity that is independent of the variabilities of the characteristics of the components used, and which make it possible to easily adapt to different nominal power supply voltage values by retaining a detection interval that depends on this nominal value.

To this effect, proposed herein is a circuit for detecting power supply disturbances in the power supply of an electronic circuit by a power supply voltage between a first power supply terminal and a second power supply terminal. The circuit comprises a voltage comparator comprising an output, a first input and a second input, the first input being configured to receive a first reference voltage. The circuit also comprises an operational transconductance amplifier comprising an output connected to the second input of the voltage comparator, an inverting input connected to the output of the operational transconductance amplifier, and a non-inverting input configured to receive a second reference voltage. A filter capacitor is provided in series between a power supply terminal and the second input of the voltage comparator. A detection signal at the output of the voltage comparator is representative of the transient exceeding, by the power supply voltage, of an authorized variation range with respect to an average value of the power supply voltage, the extent of the authorized variation being defined by a difference in voltage between the first reference voltage and the second reference voltage. The exceeding indicates a disturbance in the power supply voltage.

The disturbance detection circuit is advantageously supplemented by the following different features taken individually or according to the various possible combinations thereof:

the first reference voltage and the second reference voltage are derived from the power supply voltage, an input from among the first input and the second input of the voltage comparator is configured to receive a voltage derived from the power supply voltage by a low-pass filtering and representative of a continuous component of said power supply voltage, and the other input from among the first input and the second input of the voltage comparator is configured to receive a voltage derived from the power supply voltage by low-pass and high-pass filtering and is representative of a high-frequency component around the continuous component of said power supply voltage;

the first input of the voltage comparator is an inverting input, and the first reference voltage is greater than the second reference voltage in the absence of disturbances, the circuit for detecting disturbances being configured to detect the positive disturbances;

the first input of the voltage comparator is a non-inverting input, and the first reference voltage is less than the second reference voltage in the absence of disturbances, the circuit for detecting disturbances being configured to detect the negative disturbances;

the filter capacitor is connected to a first power supply terminal and has a capacitance adapted to perform a high-pass filtering of the power supply voltage with a cut-off frequency less than 1 MHz, and the average value of the power supply voltage corresponds to a continuous component of the power supply voltage resulting from a low-pass filtering of the power supply voltage at a cut-off voltage less than 1 MHz;

the filter capacitor is connected to a second power supply terminal and has a capacitance adapted to perform a low-pass filtering of the second reference voltage with a cut-off frequency less than 1 MHz;

the detection circuit comprises: a first detection circuit wherein the first input of the voltage comparator is an inverting input, and the first reference voltage is greater than the second reference voltage in the absence of disturbances, the first disturbance detection circuit being configured to detect the positive disturbances, and a second detection circuit wherein the first input of the voltage comparator is a non-inverting input, and the first reference voltage is less than the second reference voltage in the absence of disturbances, the second disturbance detection circuit being configured to detect the negative disturbances.

The detection circuit can include a reference circuit delivering the first reference voltage and the second reference voltage, the reference circuit comprising a series of at least three resistors in series between the first power supply terminal and the second power supply terminal: a first resistor having a first resistance value R1, a second resistor having a second resistance value R2 and a third resistor with a third resistance value R3, a high reference voltage being derived from a voltage between the first resistor and the second resistor filtered by a first filter, a low reference voltage being derived from a voltage between the second resistor and the third resistor filtered by a second filter, the first reference voltage and the second reference voltage corresponding to the high reference voltage and to the low reference voltage, wherein either the first filter and the second filter are low-pass filters, or the first filter and the second filter are high-pass filters.

Preferably, each one of the first filter and second filter comprises an operational transconductance amplifier and a capacitor, the operational transconductance amplifier comprising an output configured to deliver a reference voltage, an inverting input connected to the output of the operational transconductance amplifier, and a non-inverting input connected between two resistors in series, the capacitor being connected between the output of the operational transconductance amplifier and a power supply terminal other than the power supply terminal to which the filter capacitor is connected.

BRIEF DESCRIPTION OF THE DRAWINGS

Other characteristics, purposes and advantages of the method will come from the following description, which is purely for the purposes of information and is not limiting, and which must be read with regards to the accompanying drawings wherein.

DETAILED DESCRIPTION OF ILLUSTRATIVE EMBODIMENTS

Figure 1A:
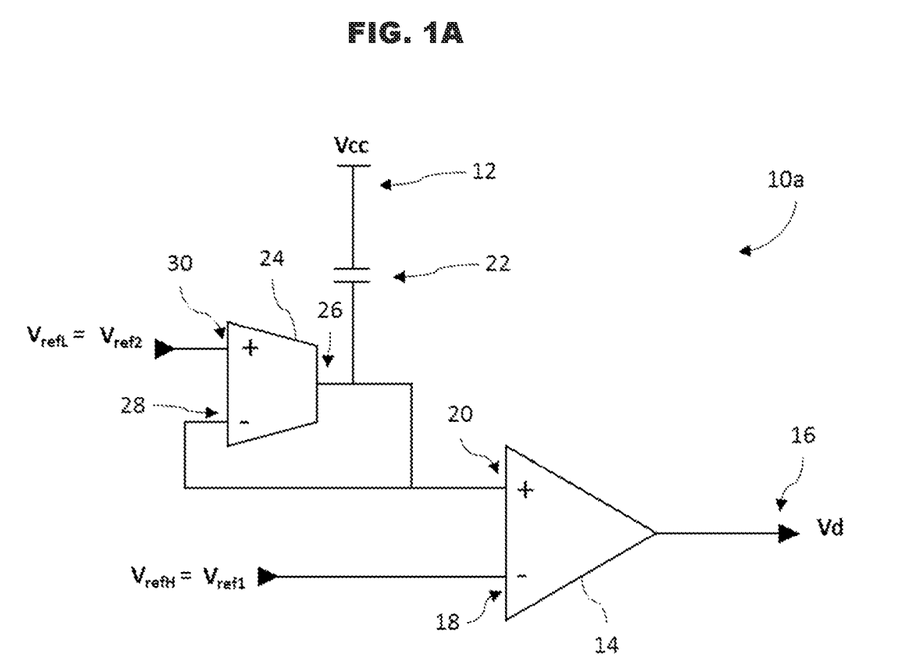
FIG. 1A is an example of a positive disturbance detection circuit according to a possible embodiment of the invention, comprising a high-pass filter.
Figure 1B:
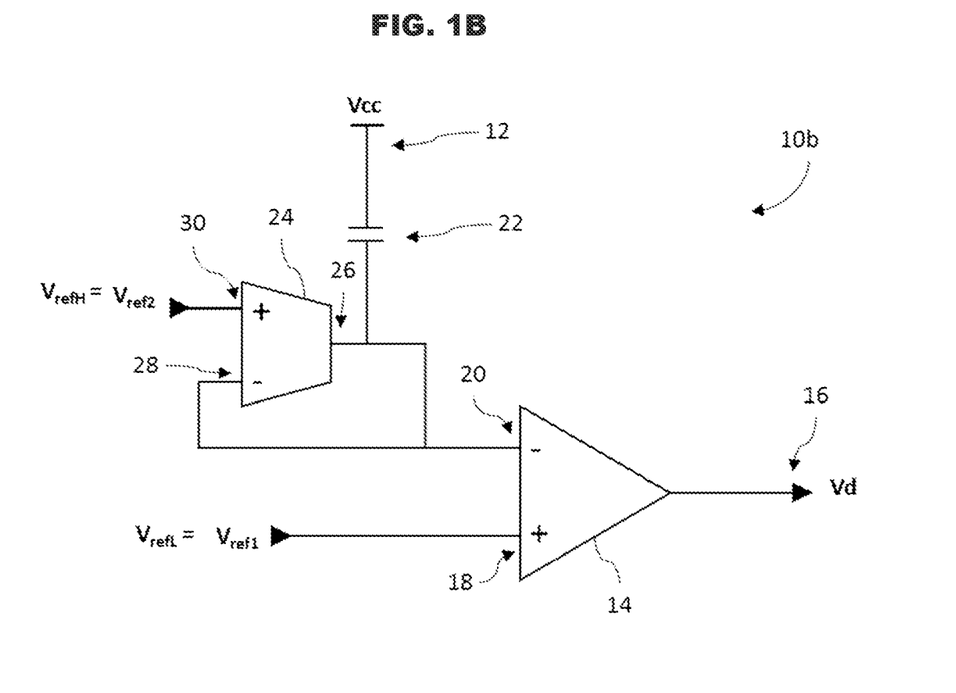
FIG. 1B is an example of a negative disturbance detection circuit according to a possible embodiment of the invention, comprising a high-pass filter.

In reference to FIGS. 1A and 1B, which show examples of positive and negative disturbance detection circuits, respectively, the detection circuit 10a, 10b is connected to a first power supply terminal 12 of the electronic circuit, at a high voltage Vcc, which defines a power supply voltage with a second power supply terminal at a low voltage Vee. In order to simplify the description hereinbelow, the second power supply terminal can be considered as the ground, the power supply voltage then being the voltage Vcc.

The detection circuit 10a, 10b comprises a voltage comparator 14 comprising an output 16, a first input 18 and a second input 20. The first input 18 is configured to receive a first reference voltage $V_{ref1}$. The result provided by the voltage comparator 14 on its output 16 is the usable voltage signal, in the form of a detection signal Vd, representative of the detection of a disturbance. A filter capacitor 22 is connected in series between the first power supply terminal 12 and the second input 20 of the voltage comparator 14. The voltage comparator 14 can be a simple comparator with a differential pair and a second gain stage. In order to reduce consumption, the second stage should be in the off state in normal time, i.e. in the absence of disturbance, which can easily be obtained by choosing to connect the output of the differential pair to a transistor gate which becomes on only in the case of disturbance detection. This also has the advantage of reducing the reaction time of the voltage comparator 14.

The detection circuit 10a, 10b comprises an operational transconductance amplifier 24 comprising an output 26 connected to the filter capacitor 22 and to the second input 20 of the voltage comparator, an inverting input 28 connected to its own output 26, and a non-inverting input 30 configured to receive a second reference voltage $V_{ref2}$.

The detection circuit 10a, 10b therefore makes use of two reference voltages $V_{ref1}$, $V_{ref2}$, that have different values, and of which the difference in voltage defines an authorized variation range for the power supply voltage Vcc. Preferably, the reference voltages $V_{ref1}$, $V_{ref2}$ are representative of the average value of the power supply voltage (Vcc), within a proportionality factor.

The operational transconductance amplifier 24 constitutes a current-depleted transconductor and, through its negative retraction loop, can be assimilated to a high-impedance resistor. The unit formed by the operational transconductance amplifier 24 and the filter capacitor 22 therefore forms a high-pass filter, configured to filter the power supply voltage Vcc coming from the power supply terminal 12. The transconductance of the amplifier 24 and the capacitance of the filter capacitor 22 are chosen in such a way as to perform a high-pass filtering with a cut-off frequency that corresponds to the needs of the detection, for example less than 1 MHz, and greater than 10 kHz.

This high-pass filtering makes it possible to select, from the variations in the power supply voltage Vcc, those able to form disturbances for the power management unit (PMU) of the electronic circuit and therefore able to allow for the injection of faults into the execution of programs or algorithms by the electronic circuit. For example, variations extending over long durations (e.g. greater than 100 μs) do not generate transient effects that can cause operating errors of the electronic circuit that can be used. Excessively abrupt variations (e.g. extending over a duration of less than 10 ns) also have no effect for the power management unit, with the integrated capacitors of the power management unit offering a sufficient rejection for disturbances of a frequency greater than 10 MHz.

Since the filter capacitor 22 is not used here as a source for the loads passing through a transistor, the capacitance of the filter capacitor 22 can be chosen much lower than in the disturbance detectors used previously while still retaining the high-pass filtering function thereof. Byway of example, the filter capacitor 22 can for example have a capacitance comprised between 50 and 500 fF, and preferably a capacitance comprised between 75 and 250 fF.

The output 26 of the operational transconductance amplifier 24 follows the second reference voltage $V_{ref2}$. The second input 20 of the voltage comparator 14 has therefore applied to it a disturbed voltage corresponding to the second reference voltage $V_{ref2}$ to which the high-frequency variations γ coming from the capacitor 22 are added. The voltage comparator 14 performs a comparison between this dis- turbed voltage ($V_{ref2}$+γ) and the first reference voltage $V_{ref1}$ applied to its first input 18. The detection signal Vd on the output 16 of the voltage comparator 14 changes state when the transient variations of power supply voltage Vcc are greater in amplitude that the difference between the first reference voltage $V_{ref1}$ and the second reference voltage $V_{ref2}$.

The particulars of this comparison depend on the type of disturbance detector. In the case of a positive disturbance detection circuit, i.e. configured to detect when the power supply voltage is transiently above the authorized variation range around the nominal value, the first input 18 is the inverting input of the voltage comparator 14 and the second input 20 of the voltage comparator 14 is the non-inverting input of the voltage comparator 14. This is the configuration shown in FIG. 1A. In this configuration, the first reference voltage $V_{ref1}$ is greater than the second reference voltage $V_{ref2}$. As long as the disturbed voltage ($V_{ref2}$+γ) remains less than the first reference voltage $V_{ref1}$, the detection signal Vd remains in a first state representative of the absence of disturbance. The detection signal Vd changes state when the disturbed voltage ($V_{ref2}$+γ) becomes greater than the first reference voltage $V_{ref1}$, i.e. when γ>$V_{ref1}$−$V_{ref2}$, meaning that the disturbance has an amplitude in voltage (with respect to a nominal value of the power supply voltage) greater than the difference between the second reference voltage $V_{ref2}$ and the first reference voltage $V_{ref1}$.

By means of a connection with the output 16 of the voltage comparator 14, the detection signal Vd can be transmitted to the electronic circuit and, according to the state of the detection signal Vd, different tasks can be implemented. In particular, when the detection signal Vd has a second state representative of the presence of a disturbance, an alert signal can be emitted indicating that an attack is in progress, the electronic circuit can be placed on standby, or any other action that makes it possible to ensure that the operating safety of the electronic circuit will not be affected by this disturbance.

In the case of a negative disturbance detection circuit, i.e. configured to detect when the power supply voltage is transiently below the authorized variation range around the nominal value of the power supply voltage Vcc, the first input 18 is the non-inverting input of the voltage comparator 14 and the second input 20 is the inverting input of the voltage comparator 14. This is the configuration shown in FIG. 1B. In this configuration, the first reference voltage $V_{ref1}$ is less than the second reference voltage $V_{ref2}$. As long as the disturbed voltage ($V_{ref2}$+γ) remains greater than the first reference voltage $V_{ref1}$, the detection signal Vd remains in a first state representative of the absence of disturbance. The detection signal Vd changes state when the disturbed voltage ($V_{ref2}$+γ) becomes less than the first reference voltage $V_{ref1}$, i.e. when γ<$V_{ref1}$−$V_{ref2}$, meaning that the disturbance has a negative amplitude in voltage (with respect to a nominal value of the power supply voltage Vcc) greater than the difference between the first reference voltage $V_{ref1}$ and the second reference voltage $V_{ref2}$.

Note that although the assembly of FIG. 1A only allows for the detection of positive disturbances, and although the assembly of FIG. 1B only allows for the detection of negative disturbances, it is possible to easily combine the two detections by using the two assemblies in parallel, thus allowing the detection circuit to detect bother the positive and negative disturbances.

It is therefore possible to provide a disturbance detection circuit a first detection circuit and a second detection circuit. In the first detection circuit, the first input 18 of the voltage comparator 14 is an inverting input. When the first reference voltage $V_{ref1}$ is greater than the second reference voltage $V_{ref2}$, the first disturbance detection circuit is configured to detect the positive disturbances. In the second detection circuit, the first input 18 of the voltage comparator 14 is a non-inverting input. When the first reference voltage $V_{ref1}$ is less than the second reference voltage $V_{ref2}$, the second disturbance detection circuit is configured to detect the negative disturbances.

With respect to detection circuits used previously, the detection circuits 10a, 10b proposed allow for a notable savings in space. In particular, the large resistors are replaced with current-depleted operational transconductance amplifiers 26, much smaller than the large resistors. Likewise, the capacitors 22 are of a lesser capacitance, as explained hereinabove, and are therefore not as large. The detection circuit 10a, 10b, can therefore be carried out on a smaller surface than previously. Furthermore, the comparison carried out by the voltage comparator 14 is much less sensitive to fluctuations in manufacturing and temperature, with respect to the use of a threshold voltage of a transistor, which improves the detection precision. Finally, although using a threshold voltage of a transistor requires that the disturbances exceed in amplitude this threshold voltage, the detection circuit 10a, 10b proposed can detect disturbances that are lower than this threshold voltage, thus allowing for the use of power supply voltages Vcc with low values, which limits the electrical consumption.

As explained hereinabove, the difference between the first reference voltage $V_{ref1}$ and the second reference voltage $V_{ref2}$ defines the authorized variation range. The difference in voltage between the first reference voltage $V_{ref1}$ and the second reference voltage $V_{ref2}$, for example expressed as a percentage of the nominal value of the power supply voltage Vcc, corresponds to the authorized variation in the power supply voltage Vcc around the nominal value thereof. For example, when the nominal power supply voltage Vcc is at 5 V, a variation in the power supply voltage of 20% around this nominal value of 5 V consists of a voltage variation range of 1 V. The first reference voltage $V_{ref1}$ and the second reference voltage $V_{ref2}$ then differ between them by 20% of the nominal value of 5 V, which is 1 V. For example, a reference voltage can be of 1.25 V and the other reference voltage can be 0.25 V. Or, a reference voltage can be of 2 V and the other reference voltage can be 1 V. When the nominal power supply voltage Vcc is at 1.5 V, a variation in the power supply voltage of 20% around this nominal value of 1.5 V consists of a voltage variation range of 0.3 V. The first reference voltage $V_{ref1}$ and the second reference voltage $V_{ref2}$ then differ by 20% of the nominal value of 1.5 V, or 0.3 V. For example, a reference voltage can be of 0.6 V and the other reference voltage can be 0.3 V. Or, a reference voltage can be of 1V and the other reference voltage can be 0.7 V. Other variations in the power supply voltage can be authorized, such as for example 10%, the difference between the reference voltages $V_{ref1}$, $V_{ref2}$ is then chosen in consequence.

It is possible to impose reference voltages $V_{ref1}$, $V_{ref2}$ at fixed values, thus setting a fixed authorized variation range. However, fixed values for reference voltages $V_{ref1}$, $V_{ref2}$ can give rise to a problem when the electronic circuit can operate with different power supply voltage Vcc values. For example, if a margin of ±1V is acceptable when the power supply voltage Vcc has a nominal value of 5 V, such a margin is no longer acceptable when the power supply voltage Vcc has a nominal value of 1.5 V.

In order to allow the detection circuit to adapt to various power supply voltages Vcc, it is preferable that the reference voltages $V_{ref1}$, $V_{ref2}$ be adaptive according to the power supply voltage since the extent of the authorized variation range with respect to the nominal value of the power supply voltage Vcc is a constraint to be complied with, for example ±10% or ±20% with respect to the nominal value of the power supply voltage Vcc. Consequently, the two reference voltages $V_{ref1}$, $V_{ref2}$ are preferably proportional to the power supply voltage Vcc, and more precisely to an average value of the power supply voltage Vcc. The two reference voltages $V_{ref1}$, $V_{ref2}$ are preferably also linked together according to a constant factor, and one reference voltage is therefore proportional to the other. Thus, the two reference voltages $V_{ref1}$, $V_{ref2}$ vary together by retaining a difference in voltage between them that is constant when this difference is expressed according to the power supply voltage Vcc.

Figure 2:
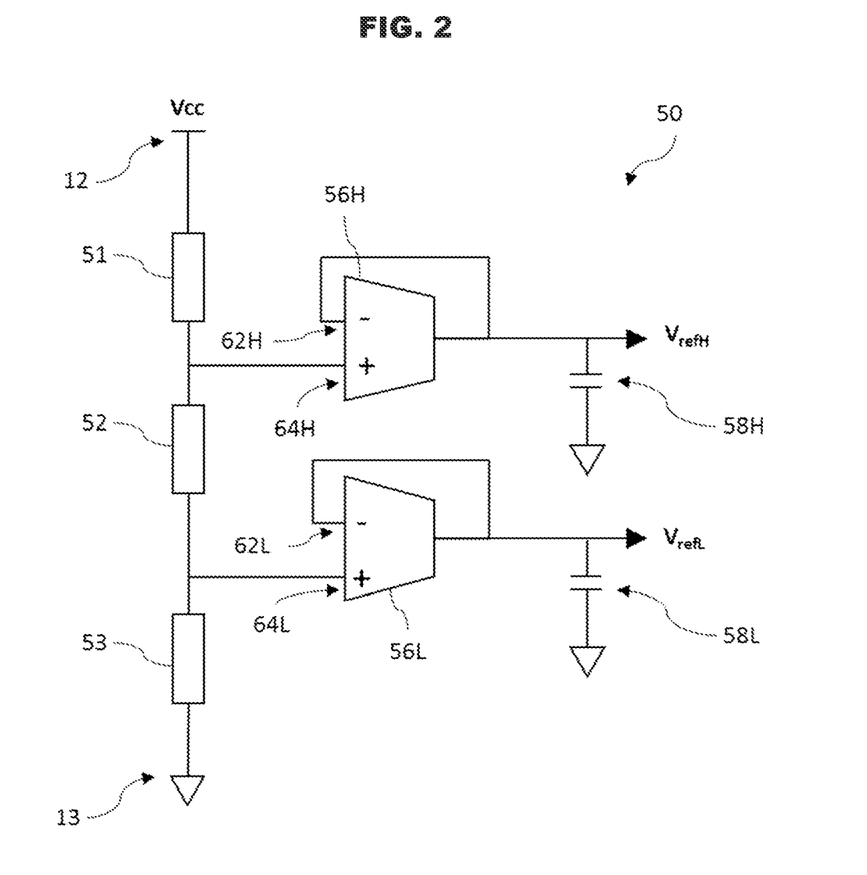
FIG. 2 is an example of a reference circuit delivering the first reference voltage and the second reference voltage to a disturbance detection circuit such as the one shown in FIGS. 1a and 1b by deriving the reference voltages by a low-pass filtering.

The best way to link the two reference voltages $V_{ref1}$, $V_{ref2}$ and the power supply voltage Vcc together consists in deriving the two reference voltages $V_{ref1}$, $V_{ref2}$ from the power supply voltage Vcc. To this effect, the detection circuit 10a, 10b comprises a reference circuit 50 delivering the first reference voltage $V_{ref1}$ and the second reference voltage $V_{ref2}$, from the power supply voltage Vcc, of which an example embodiment is shown in FIG. 2. The reference circuit 50 comprising a series of at least three resistors 51, 52, 53 in series between a first power supply terminal 12 at a first voltage Vcc and a second power supply terminal 13 at a second voltage Vee (comparable to the ground), defining between them the power supply voltage. Note that it is possible to use as a series of resistors elements present at other locations of the electronic circuit, such as for example resistive divider bridges.

A high reference voltage $V_{refH}$ is derived from a voltage between the first resistor 51 and the second resistor 52 filtered by a low-pass filter. A low reference voltage $V_{refL}$ is derived from a voltage between the second resistor 52 and the third resistor 53 filtered by a low-pass filter. The first reference voltage $V_{ref1}$ and the second reference voltage $V_{ref2}$ each correspond either to the high reference voltage $V_{refH}$, or to the low reference voltage $V_{refL}$, according to the assemblies. More precisely, for a detection of positive disturbances, the first reference voltage $V_{ref1}$ corresponds to the high reference voltage $V_{refH}$ and the second reference voltage $V_{ref2}$ corresponds to the low reference voltage $V_{refL}$. Inversely, for a detection of negative disturbances, the first reference voltage $V_{ref1}$ corresponds to the low reference voltage $V_{refL}$ and the second reference voltage $V_{ref2}$ corresponds to the high reference voltage $V_{refH}$.

It is the values of resistors 51, 52, 53 that define the respective values of the high reference voltage $V_{refH}$ and of the low reference voltage $V_{refL}$, and which therefore set the difference between the first reference voltage $V_{ref1}$ and the second reference voltage $V_{ref2}$. The series of resistors therefore comprises a first resistor 51 having a first resistance value R1, a second resistor 52 having a second resistance value R2 and a third resistor 53 with a third resistance value R3. The first reference voltage $V_{ref1}$ and the second reference voltage $V_{ref2}$ are defined with respect to the power supply voltage Vcc according to ratios that make use of the first resistance value R1, the second resistance value R2, and the third resistance value R3. More precisely, the high reference voltage $V_{refH}$ corresponds to:

$$V_{refH} = \frac{R2 + R3}{R1 + R2 + R3} Vcc \qquad \text{[Equation 1]}$$

while the low reference voltage $V_{refL}$ corresponds to:

$$V_{refL} = \frac{R3}{R1 + R2 + R3} Vcc \quad \text{[Equation 2]}$$

It can therefore be seen that the high reference voltage $V_{refH}$ is greater than the low reference voltage $V_{refL}$, according to a constant factor k defined by the second resistance value R2 and by the third resistance value R3:

$$k = \frac{R2 + R3}{R3} \quad \text{[Equation 3]}$$

in such a way that regardless of the value of the power supply voltage Vcc, $V_{refH} = k \cdot V_{refL}$ always. Thus, the proportionality between the high reference voltage $V_{refH}$ and the low reference voltage $V_{refL}$ is always retained. Of course, the resistance values R1, R2, R3 are chosen so as to obtain the desired values for the first reference voltage $V_{ref1}$ and the second reference voltage $V_{ref2}$. For example, if it is desired that the high reference voltage $V_{refH}$ correspond to 40% of the power supply voltage Vcc, and that the reference voltage $V_{refL}$ correspond to 20% of the power supply voltage Vcc (establishing an authorized variation range of 20% around the nominal value of the power supply voltage Vcc), it is then sufficient to choose R1=3·R2=3·R3. It is also possible to choose R1=0 or R3=0 if it is desired that one of the reference voltages $V_{ref1}$ or $V_{ref2}$ be that of one of the power supply terminals of the circuit, subject to a comparator 14 capable of operating with input voltages close to the power supplies thereof.

The low-pass filtering is used so that the high reference voltage $V_{refH}$ and the low reference voltage $V_{refL}$ are proportional to a temporal average of the reference voltage Vcc, i.e. of a continuous component of the reference voltage Vcc, without taking account of a high-frequency component formed by the transient disturbances. Each low-pass filter comprises an operational transconductance amplifier $56_H$, $56_L$ and a capacitor $58_H$, $58_L$. The operational transconductance amplifier $56_H$, $56_L$ comprises an output $60_H$, $60_L$ configured to deliver a reference voltage, i.e. either the high reference voltage $V_{refH}$ or the low reference voltage $V_{refL}$. The capacitor $58_H$, $58_L$ is connected between the output $60_H$, $60_L$ of the operational transconductance amplifier $56_H$, $56_L$ and the second power supply terminal Vee (e.g. the ground). The inverting input $62_H$, $62_L$ of the operational transconductance amplifier $56_H$, $56_L$ is connected to the output $60_H$, $60_L$ of the operational transconductance amplifier $56_H$, $56_L$, and the non-inverting input $64_H$, $64_L$ of the operational transconductance amplifier $56_H$, $56_L$ is connected between two resistors 51, 52, 53 in series. More precisely, the non-inverting input $64_H$ of the operational transconductance amplifier $56_H$ delivering the high reference voltage $V_{refH}$ is connected to the node between the first resistor 51 and the second resistor 52, while the non-inverting input $64_L$ of the operational transconductance amplifier $56_L$ delivering the low reference voltage $V_{refL}$ is connected to the node between the second resistor 52 and the third resistor 53.

According to the configurations, one of the outputs $60_H$, $60_L$ of the operational transconductance amplifiers $56_H$, $56_L$, is connected to the non-inverting input 18 of the comparator 14, while the other of the outputs $60_H$, $60_L$ of the operational transconductance amplifiers $56_H$, $56_L$, is connected to the non-inverting input 30 of the operational transconductance amplifier 24.

The reference circuit 50 therefore delivers the first reference voltage $V_{ref1}$ and the second reference voltage $V_{ref2}$, which are proportional to a continuous component of the reference voltage Vcc, thanks to the low-pass filtering performed on the divided voltages of the power supply voltage. The characteristics of the two capacitors 58H, 58L are preferably identical, in such a way that the filterings are also identical. The capacitance of the capacitors 58H, 58L are chosen so that the low-pass filtering has a cut-off frequency less than 1 MHz, and preferably less than 500 kHz, and greater than 10 kHz. By way of example, capacitors 58H, 58L can have a capacitance comprised between 50 and 500 fF, and preferably a capacitance comprised between 75 and 250 fF.

Thanks to the reference circuit 50, the reference voltages $V_{ref1}$, $V_{ref2}$ are self-adapting according to the power supply voltage Vcc and guarantee a constant extent of the authorized variation range with respect to the nominal value of the power supply voltage Vcc. It is not necessary to perform any configuration whatsoever of the detection circuit 10a, 10b, nor is it necessary to determine what the power supply voltage used is. The detection circuit 10a, 10b indeed simply detects that a transient component (amplitude of the high-frequency variations γ) of the power supply voltage Vcc does not exceed an authorized variation range (determined by the difference between the reference voltages $V_{ref1}$, $V_{ref2}$) with respect to a continuous component (temporal average) of the power supply voltage Vcc.

Using a reference circuit 50 makes it possible to continuously make the detection of disturbances self-adaptive according to the power supply voltage Vcc. Alternatively, it is however possible to use a reference voltage generator unit, configured to deliver reference voltages $V_{ref1}$, $V_{ref2}$ at predefined values. However, in order to allow for an adaptation to different values of the power supply voltage, it is then preferable to provide a voltage detector that makes it possible to switch between different reference voltage values $V_{ref1}$, $V_{ref2}$ according to the detected values of the power supply voltage Vcc.

Note that the low-pass filtering and high-pass filtering are complementary, and can be inversed. It is sufficient indeed for an input from among the first input 18 and the second input 20 of the voltage comparator 14 be configured to receive a voltage derived from the power supply voltage by a low-pass filtering and representative of a continuous component of said power supply voltage, and that the other input from among the first input 18 and the second input 20 of the voltage comparator 14 be configured to receive a voltage derived from the power supply voltage by low-pass and high-pass filtering and representative of a high-frequency component around the continuous component of said power supply voltage.

Figure 3:
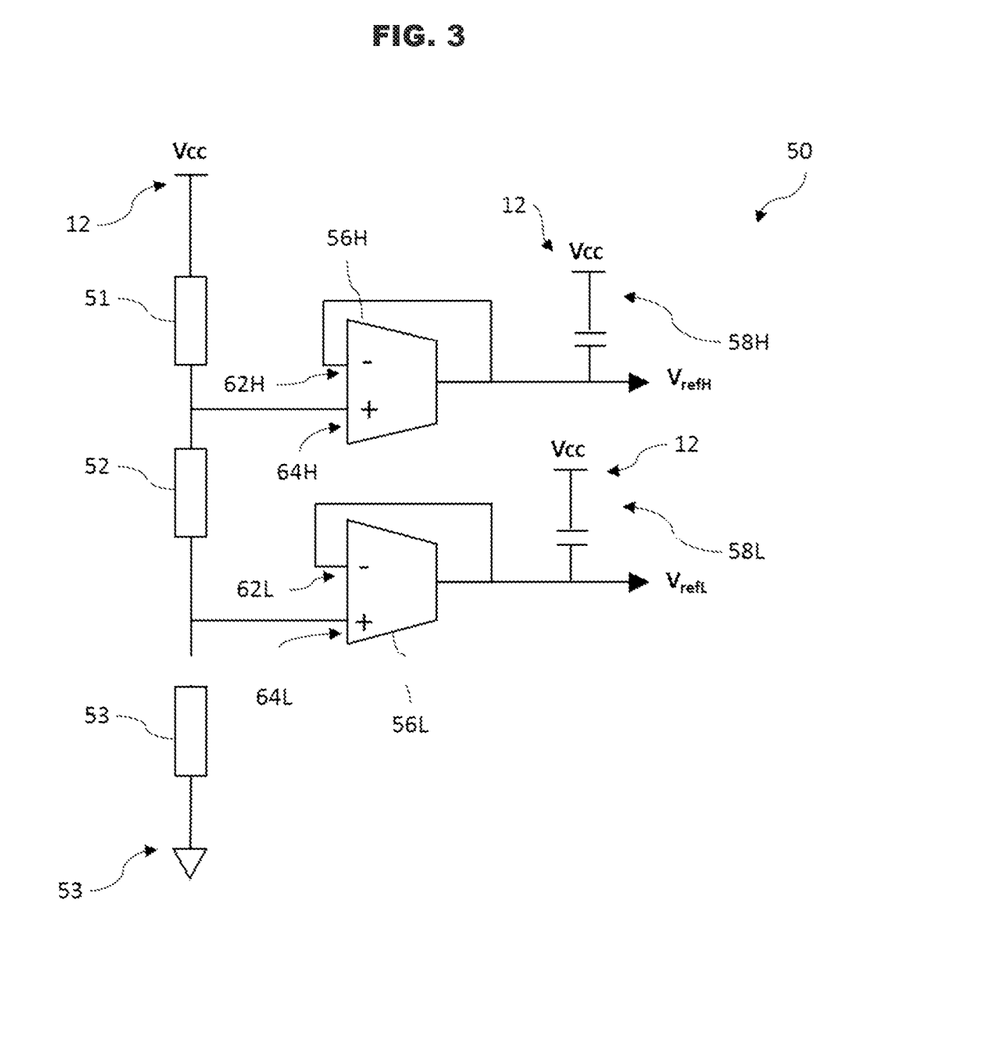
FIG. 3 is an example of a reference circuit delivering the first reference voltage and the second reference voltage to the disturbance detection circuit by deriving the reference voltages by a high-pass filtering.
Figure 4A:
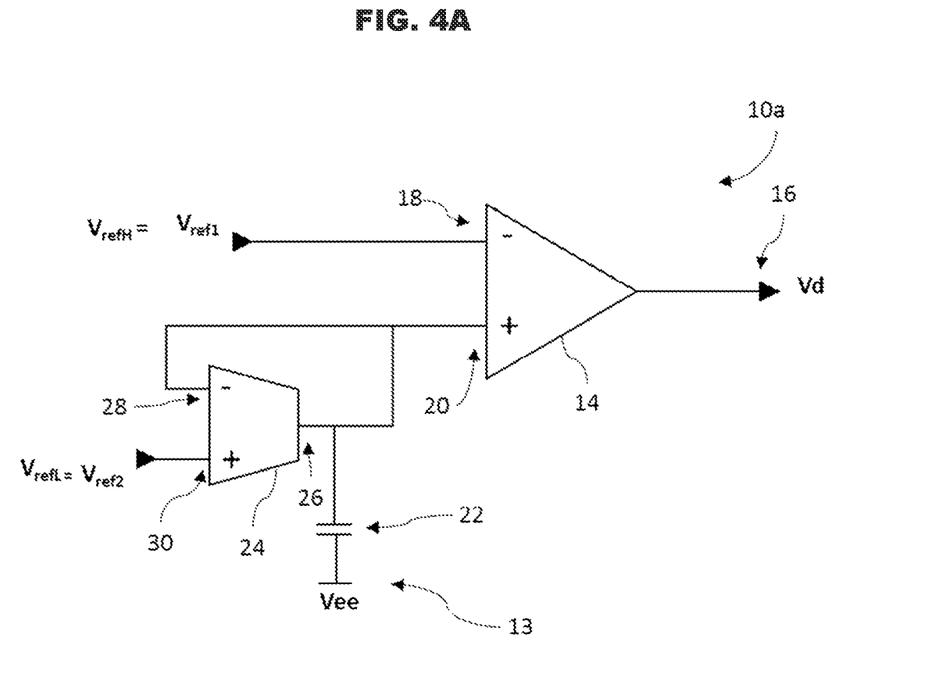
FIG. 4A is an example of a positive disturbance detection circuit according to a possible embodiment of the invention, comprising a low-pass filter.
Figure 4B:
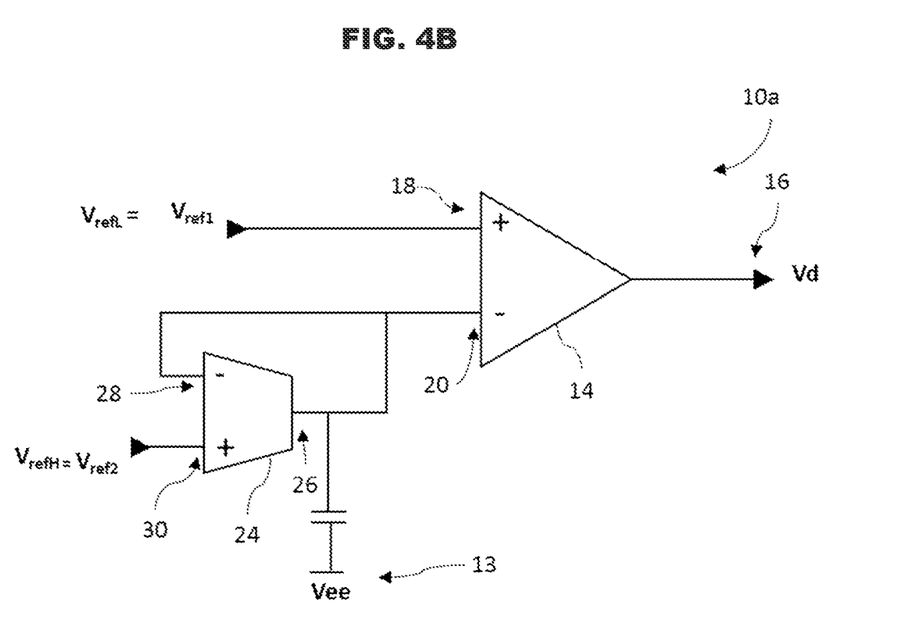
FIG. 4B is an example of a negative disturbance detection circuit according to a possible embodiment of the invention, comprising a low-pass filter.

As such, FIGS. 3, 4A and 4B show circuits equivalent to the circuits of FIGS. 1A, 1B and 2, wherein the low-pass and high-pass filters have been inversed.

Thus, FIG. 3 shows a reference circuit 50 similar to the one of FIG. 2, except in that the capacitors 58H, 58L are connected to the first power supply terminal 12 at the voltage Vcc instead of being connected to the second power supply terminal 13. Each high-pass filter is thus formed from an operational transconductance amplifier $56_H$, $56_L$ and a capacitor $58_H$, $58_L$. For each low-pass filter, the transconductance of the amplifier 56H, 56L and the capacitance of the capacitor $58_H$, $58_L$ are chosen in such a way as to perform a low-pass filtering with a cut-off frequency that corresponds to the needs for detection, for example less than 1 MHz, and greater than 10 kHz.

Likewise, FIGS. 3, 4A and 4B show detection circuits wherein the unit formed by the operational transconductance amplifier 24 and the filter capacitor 22 forms a high-pass filter instead of a low-pass filter. To do this, the filter capacitor 22 is connected in series between the second input 20 of the voltage comparator 14 and the second power supply terminal 13 at the voltage Vee, instead of being connected to the first power supply terminal 12. The transconductance of the amplifier 24 and the capacitance of the filter capacitor 22 are chosen in such a way as to perform a filtering with a cut-off frequency less than 1 MHz, and preferably less than 500 kHz, and greater than 10 kHz. By way of example, the filter capacitor 22 can have a capacitance comprised between 50 and 500 fF, and preferably a capacitance comprised between 75 and 250 fF. The other characteristics of the detection circuit are the same as those described in reference to FIGS. 1A and 1B.

The invention is not limited to the embodiment described and shown in the accompany figures. Modifications remain possible, in particular from the standpoint of the constitution of the various technical characteristics or by substitution of technical equivalents, without however leaving the scope of protection of the invention.

What is claimed is:

1. A circuit comprising:
   a first power supply terminal;
   a second power supply terminal, wherein a voltage between the first power supply terminal and the second power supply terminal is a power supply voltage;
   a first reference voltage terminal configured to carry a first reference voltage;
   a second reference voltage terminal configured to carry a second reference voltage that is different from the first reference voltage;
   a voltage comparator comprising an output, a first input and a second input, the first input being coupled to the first reference voltage terminal;
   an operational transconductance amplifier comprising an output coupled to the second input of the voltage comparator, an inverting input coupled to the output of the operational transconductance amplifier, and a non-inverting input coupled to the second reference voltage terminal; and
   a filter capacitor coupled in series between a power supply terminal and the second input of the voltage comparator, the power supply terminal being either the first power supply terminal or the second power supply terminal.

2. The circuit according the claim 1, wherein a disturbance detection signal at the output of the voltage comparator is representative of a transient in the power supply voltage that exceeds an authorized variation range with respect to an average value of the power supply voltage, the extent of the authorized variation range being defined by a difference in voltage between the first reference voltage and the second reference voltage.

3. The circuit according to claim 1, further comprising:
   a first resistor, a second resistor and a third resistor coupled in series between the first power supply terminal and the second power supply terminal;
   a second operational transconductance amplifier having an output coupled to the first reference voltage terminal, a first input coupled between the first and second resistors, and a second input coupled to the output of the second operational transconductance amplifier;
   a second capacitor coupled to an output of the second operational transconductance amplifier;
   a third operational transconductance amplifier having an output coupled to the second reference voltage terminal, a first input coupled between the second and third resistors, and a second input coupled to the output of the third operational transconductance amplifier; and
   a third capacitor coupled to an output of the third operational transconductance amplifier.

4. The circuit according to claim 1, wherein an input from among the first input and the second input of the voltage comparator is configured to receive a voltage derived from the power supply voltage by a low-pass filtering and representative of a continuous component of the power supply voltage, and wherein the other input from among the first input and the second input of the voltage comparator is configured to receive a voltage derived from the power supply voltage by high-pass filtering and is representative of a high-frequency component around the continuous component of the power supply voltage.

5. The circuit according to claim 4, wherein the other input from among the first input and the second input of the voltage comparator is configured to receive the voltage derived from the power supply voltage by low-pass and high-pass filtering.

6. The circuit according to claim 1, wherein the first input of the voltage comparator is an inverting input and the first reference voltage is greater than the second reference voltage in the absence of disturbances, the circuit being configured to detect positive disturbances.

7. The circuit according to claim 1, wherein the first input of the voltage comparator is a non-inverting input and the first reference voltage is less than the second reference voltage in the absence of disturbances, the circuit being configured to detect negative disturbances.

8. The circuit according to claim 1, wherein the filter capacitor is coupled to the first power supply terminal and has a capacitance adapted to perform a high-pass filtering of the power supply voltage with a cut-off frequency less than 1 MHz, and wherein an average value of the power supply voltage corresponds to a continuous component of the power supply voltage resulting from a low-pass filtering of the power supply voltage at a cut-off voltage less than 1 MHz.

9. The circuit according to claim 1, wherein the filter capacitor is connected to the second power supply terminal and has a capacitance adapted to perform a low-pass filtering of the second reference voltage with a cut-off frequency less than 1 MHz.

10. The circuit according to claim 1, comprising a reference circuit comprising a first resistor, a second resistor and a third resistor coupled in series between the first power supply terminal and the second power supply terminal, wherein the first reference voltage is derived from a voltage between the first resistor and the second resistor filtered by a first filter and the second reference voltage is derived from a voltage between the second resistor and the third resistor filtered by a second filter.

11. The circuit according to claim 10, wherein the first filter and the second filter are low-pass filters.

12. The circuit according to claim 10, wherein the first filter and the second filter are high-pass filters.

13. The circuit according to claim 10, wherein the first filter comprises a second operational transconductance amplifier and a first capacitor coupled to an output of the second operational transconductance amplifier;

wherein the second filter comprises a third operational transconductance amplifier and a second capacitor coupled to an output of the third operational transconductance amplifier;

wherein the output of the second operational transconductance amplifier is coupled to the first reference voltage terminal; and wherein the output of the third operational transconductance amplifier is coupled to the second reference voltage terminal.

14. The circuit according to claim 13, wherein an inverting input of the second operational transconductance amplifier is connected to the output of the second operational transconductance amplifier and a non-inverting input of the second operational transconductance amplifier is coupled between the first and second resistors, the first capacitor being connected between the output of the second operational transconductance amplifier and that first or second power supply terminal that is not the power supply terminal.

15. A circuit comprising:
a first power supply terminal;
a second power supply terminal;
a first reference voltage terminal configured to carry a first reference voltage;
a second reference voltage terminal configured to carry a second reference voltage that is less than the first reference voltage;
a first voltage comparator comprising an output, an inverting input and a non-inverting input, the inverting input being coupled to the first reference voltage terminal;
a first operational transconductance amplifier comprising an output coupled to the non-inverting input of the first voltage comparator, an inverting input coupled to the output of the first operational transconductance amplifier, and a non-inverting input coupled to the second reference voltage terminal;
a first filter capacitor in series between the first power supply terminal and the non-inverting input of the first voltage comparator;
a second voltage comparator comprising an output, an inverting input and a non-inverting input, the non-inverting input being coupled to the second reference voltage terminal;
a second operational transconductance amplifier comprising an output coupled to the inverting input of the second voltage comparator, an inverting input coupled to the output of the second operational transconductance amplifier, and a non-inverting input coupled to the second reference voltage terminal; and
a second filter capacitor in series between the second power supply terminal and the inverting input of the second voltage comparator.

16. The circuit according to claim 15, further comprising:
a first resistor, a second resistor and a third resistor coupled in series between the first power supply terminal and the second power supply terminal;
a third operational transconductance amplifier having an output coupled to the first reference voltage terminal, a first input coupled between the first and second resistors, and a second input coupled to the output of the third operational transconductance amplifier;
a third capacitor coupled to an output of the third operational transconductance amplifier;
a fourth operational transconductance amplifier having an output coupled to the second reference voltage terminal, a first input coupled between the second and third resistors, and a second input coupled to the output of the fourth operational transconductance amplifier; and
a fourth capacitor coupled to an output of the fourth operational transconductance amplifier.

17. A method of detecting disturbances in a power supply voltage between a first power supply terminal and a second power supply terminal, the method comprising:
applying a first reference voltage to a first input of an operational transconductance amplifier;
filtering an output of the operational transconductance amplifier;
applying the output of the operational transconductance amplifier to a second input of the operational transconductance amplifier and to a first input of a voltage comparator;
applying a second reference voltage to a second input of the voltage comparator, the second reference voltage being different than the first reference voltage; and
analyzing a detection signal at an output of the voltage comparator to determine whether there is a disturbance in the power supply voltage.

18. The method according to claim 17, wherein analyzing the detection signal comprises detecting a change in the detection signal to determine that there is a disturbance in the power supply voltage because a voltage level of the detection signal exceeds an authorized variation range with respect to an average value of the power supply voltage, wherein the authorized variation range is defined by a difference in voltage between the first reference voltage and the second reference voltage.

19. The method according to claim 18, wherein the power supply voltage is generated by a power supply of a secure electronic device, the method further comprising taking action to prevent negative consequences that could be caused by a hacker attack on the secure electronic device.

20. The method according to claim 17, wherein the first input of the voltage comparator is an inverting input and the first reference voltage is greater than the second reference voltage in the absence of disturbances, wherein analyzing the detection signal comprises detecting a change in the detection signal to determine whether there is a positive disturbance in the power supply voltage.

21. The method according to claim 17, wherein the first input of the voltage comparator is a non-inverting input and the first reference voltage is less than the second reference voltage in the absence of disturbances, wherein analyzing the detection signal comprises detecting a change in the detection signal to determine whether there is a negative disturbance in the power supply voltage.

* * * * *